(12) United States Patent
Choi et al.

(10) Patent No.: US 9,627,314 B2
(45) Date of Patent: Apr. 18, 2017

(54) FUSE STRUCTURE AND METHOD OF BLOWING THE SAME

(71) Applicant: Samsung Electronics Co., Ltd., Suwon-si (KR)

(72) Inventors: Hyun-Min Choi, Uiwang-si (KR); Shigenobu Maeda, Seongnam-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/986,872

(22) Filed: Jan. 4, 2016

(65) Prior Publication Data

US 2016/0118342 A1 Apr. 28, 2016

Related U.S. Application Data

(62) Division of application No. 14/261,505, filed on Apr. 25, 2014, now Pat. No. 9,230,925.

(30) Foreign Application Priority Data

Sep. 16, 2013 (KR) ........................ 10-2013-0111396

(51) Int. Cl.
| | |
|---|---|
| *H01L 23/525* | (2006.01) |
| *H01L 23/62* | (2006.01) |
| *H01L 21/768* | (2006.01) |
| *H01L 23/498* | (2006.01) |
| *H01L 23/522* | (2006.01) |
| *H01L 23/528* | (2006.01) |
| *H01L 23/532* | (2006.01) |
| *H01L 27/112* | (2006.01) |

(52) U.S. Cl.
CPC .... *H01L 23/5256* (2013.01); *H01L 21/76886* (2013.01); *H01L 23/49827* (2013.01); *H01L 23/528* (2013.01); *H01L 23/5226* (2013.01); *H01L 23/53238* (2013.01); *H01L 23/53252* (2013.01); *H01L 23/53266* (2013.01); *H01L 23/62* (2013.01); *H01L 27/11206* (2013.01); *H01L 2924/0002* (2013.01)

(58) Field of Classification Search
None
See application file for complete search history.

(56) References Cited

U.S. PATENT DOCUMENTS

| | | | |
|---|---|---|---|
| 7,176,551 B2 | 2/2007 | Cheng et al. | |
| 7,642,176 B2 | 1/2010 | Cheng et al. | |
| 7,892,926 B2 | 2/2011 | Barth et al. | |
| 8,143,694 B2 | 3/2012 | Choserot et al. | |
| 8,174,091 B2 | 5/2012 | Thei et al. | |

(Continued)

FOREIGN PATENT DOCUMENTS

| | | |
|---|---|---|
| JP | 2012-129403 | 7/2012 |
| KR | 1020090014824 A | 2/2009 |
| KR | 1020110001720 A | 1/2011 |

*Primary Examiner* — Daniel Whalen
(74) *Attorney, Agent, or Firm* — Myers Bigel, P.A.

(57) ABSTRACT

A fuse structure and a method of blowing the same are provided. The fuse structure includes a conductive line on a substrate, first and second vias on the conductive line that are spaced apart from each other, a cathode electrode line that is electrically connected to the first via, an anode electrode line that is electrically connected to the second via, and a dummy pattern that is adjacent at least one of the cathode and anode electrode lines and electrically isolated from the conductive line.

19 Claims, 19 Drawing Sheets

(56) References Cited

U.S. PATENT DOCUMENTS

| | | |
|---|---|---|
| 8,324,662 B2 | 12/2012 | Kubota et al. |
| 8,384,131 B2 | 2/2013 | Lee et al. |
| 9,099,469 B2 | 8/2015 | Choi |
| 2007/0090486 A1 | 4/2007 | Otsuka et al. |
| 2009/0039480 A1 | 2/2009 | Lee |
| 2009/0057819 A1 | 3/2009 | Shin |
| 2010/0117190 A1* | 5/2010 | Chuang ............... H01L 23/5256 257/529 |
| 2010/0123212 A1 | 5/2010 | Chung |
| 2011/0298086 A1 | 12/2011 | Kim et al. |
| 2012/0261793 A1 | 10/2012 | Yang et al. |
| 2013/0071998 A1 | 3/2013 | Li et al. |

\* cited by examiner

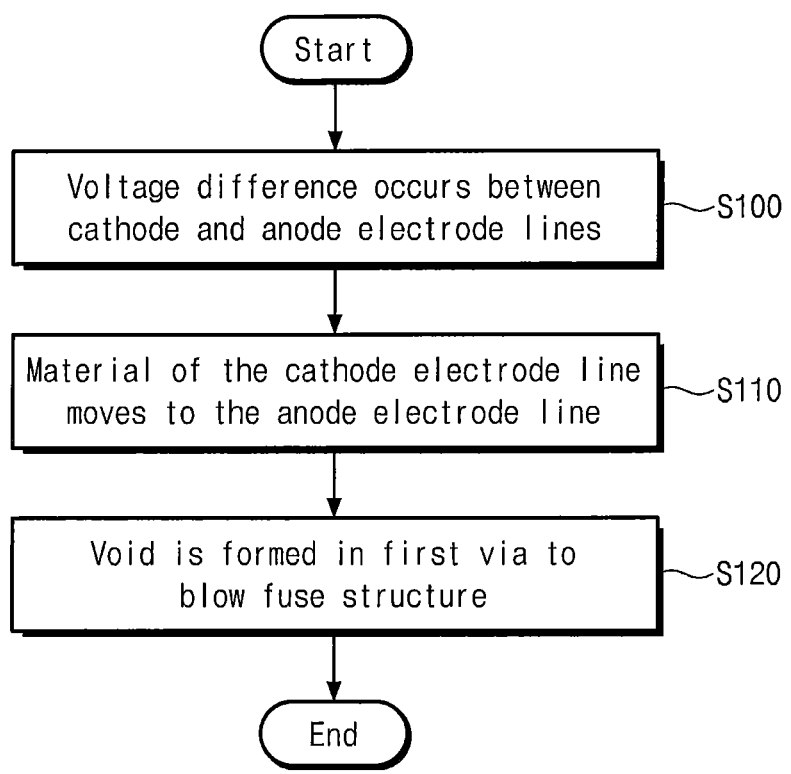

Device Region | Fuse Region

Device Region | Fuse Region

FUSE STRUCTURE AND METHOD OF BLOWING THE SAME

CROSS-REFERENCE TO RELATED APPLICATIONS

This U.S. non-provisional patent application claims priority under 35 U.S.C. §120 to U.S. patent application Ser. No. 14/261,505, filed Apr. 25, 2015, which in turn claims priority under 35 U.S.C. §119 to Korean Patent Application No. 10-2013-0111396, filed on Sep. 16, 2013, the entire content of both of which are incorporated herein by reference.

BACKGROUND OF THE INVENTION

This disclosure relates to semiconductor devices that include a fuse and, more particularly, to semiconductor devices that include an electrical fuse.

Semiconductor memory devices (chips) that are formed on a semiconductor substrate are electrically tested prior to assembly. As a result of this testing, the semiconductor chips are classified as being either defective or non-defective. When a chip is classified as being defective because it has at least one defective cell, the defective cell(s) may be replaced with redundant cells using a repair process. In order to repair a defective cell, predetermined fuses are blown, i.e., programmed, such that the redundant cell has the address of the defective cell. By applying a voltage to both ends of a fuse that is used in the repair process, a resistance across the fuse may be sensed to determine whether the fuse has been blown. The fuses that may be used in such repair processes include laser fuses that are blown using a laser and electrical fuses that are blown by applying a voltage across the fuse.

SUMMARY OF THE INVENTION

Some embodiments of the inventive concept provide a fuse structure. The fuse structure may include a conductive line on a substrate; first and second vias on the conductive line that are spaced apart from each other; a cathode electrode line that is electrically connected to the first via; an anode electrode line that is electrically connected to the second via; and a dummy pattern disposed adjacent at least one of the cathode and anode electrode lines that is electrically isolated from the conductive line.

In an exemplary embodiment of the inventive concept, the first via and the cathode electrode line may include substantially the same material, and the second via and the anode electrode line may include substantially the same material.

In an exemplary embodiment of the inventive concept, the cathode and anode electrode lines may include substantially the same material.

In an exemplary embodiment of the inventive concept, an electromigration rate of the material included in the cathode and anode electrode lines may be higher than an electromigration rate of the material included in the conductive line.

In an exemplary embodiment of the inventive concept, the cathode and anode electrode lines and the first and second vias may include copper or a copper compound, and the conductive line may include tungsten, aluminum, silver, gold, and/or a compound thereof.

In an exemplary embodiment of the inventive concept, the dummy pattern may include a first dummy pattern adjacent the cathode electrode line; and a second dummy pattern adjacent the anode electrode line. The first and second dummy patterns may include substantially the same material as the material included in the cathode and the anode electrode lines.

In an exemplary embodiment of the inventive concept, a length-to-width ratio of the conductive line may be between about 1 and about 100.

In an exemplary embodiment of the inventive concept, a length-to-width ratio of the cathode electrode line may be between about 1 and about 100, and a length-to-width ratio of the anode electrode line may be between about 1 and about 100.

In an exemplary embodiment of the inventive concept, the fuse structure may further include a first barrier layer covering a bottom surface and a side surface of the conductive line; a second barrier layer covering a bottom surface and a side surface of the first via and a side surface of the cathode electrode line a bottom surface and a side surface of the second via and a side surface of the anode electrode line.

In an exemplary embodiment of the inventive concept, the dummy pattern may have substantially the same shape as one of the cathode and anode electrode lines.

In an exemplary embodiment of the inventive concept, a length of the conductive line may be three times greater than a center-to-center distance between the first and second vias.

In an exemplary embodiment of the inventive concept, a dimension of each of the first and second vias may have a minimum critical dimension of a semiconductor device that includes the fuse structure.

Some embodiments of the inventive concept provide a method of blowing a fuse structure that includes a conductive line on a substrate, first and second vias on the conductive line and spaced apart from each other, a cathode electrode line electrically connected to the first via, and an anode electrode line electrically connected to the second via. The conductive line includes a first material having a first electromigration rate and the first and second vias and the cathode and anode electrode lines include a second material having a second electromigration rate that is higher than the first electromigration rate. The method may include letting a voltage difference occur between the cathode and anode electrode lines; moving a portion of the second material of the cathode electrode line through the first via, the conductive line, and the second via to the anode electrode line in order to increase a width of the anode electrode line; and forming a void in the first via to blow the fuse structure.

In an exemplary embodiment of the inventive concept, electrons may migrate downstream from the cathode electrode line to the first via.

In an exemplary embodiment of the inventive concept, the first material may include at least one of tungsten, aluminum, silver, gold, and a compound thereof, and the second material may include at least one of copper and a copper compound.

Further embodiments of the inventive concept provide a semiconductor device that has a semiconductor substrate having a device region having a plurality of semiconductor circuits and a fuse region having a fuse structure. The fuse structure may include a conductive line that includes a first material having a first electromigration rate, a first via and a second via that is spaced apart from the first via on the conductive line; a cathode electrode line on the first via and electrically connected to the conductive line through the first via; an anode electrode line on the second via and electrically connected to the conductive line through the second via; and a dummy conductive pattern adjacent at least one of the cathode electrode line and the anode electrode line and that is electrically isolated from the conductive line. The first via, the second via, the cathode electrode line, the anode electrode line and the conductive dummy pattern each include a second material having a second electromigration rate that exceeds the first electromigration rate.

In an exemplary embodiment, a width of the cathode electrode line exceeds a width of the first via, and a width of the anode electrode line exceeds a width of the second via.

In an exemplary embodiment, the dummy conductive pattern comprises a first dummy conductive pattern adjacent the cathode electrode line and a second dummy conductive pattern adjacent the anode electrode line, the cathode and anode electrode lines being between the first and second dummy patterns and the cathode and electrode anode lines each having a top surface that is the same height above a bottom surface of the semiconductor substrate as are the top surfaces of the first and second dummy conductive patterns.

In an exemplary embodiment, the conductive line extends in a first direction, and the cathode electrode line, the anode electrode line and the first and second dummy conductive patterns each extend in a second direction that is substantially perpendicular to the first direction.

In an exemplary embodiment, the first material is selected from the group of tungsten, aluminum, silver and gold and the second material includes copper.

BRIEF DESCRIPTION OF THE DRAWINGS

The inventive concept will become more apparent in view of the attached drawings and the accompanying detailed description. The embodiments depicted in the drawings are provided by way of example, and not by way of limitation. In the drawings and the detailed description that follows, like reference numerals refer to the same or similar elements. The drawings are not necessarily to scale, with the emphasis instead being placed upon illustrating aspects of the inventive concept.

FIG. 3 is a flowchart illustrating a method of blowing a fuse structure according to an exemplary embodiment of the inventive concept.

FIGS. 7A to 15A are top plan views illustrating a method of manufacturing a fuse structure according to an exemplary embodiment of the inventive concept.

FIGS. 7B to 15B are cross-sectional views taken along the lines I-I' and II-II' in FIGS. 7A to 15A.

DETAILED DESCRIPTION

Figure 1:
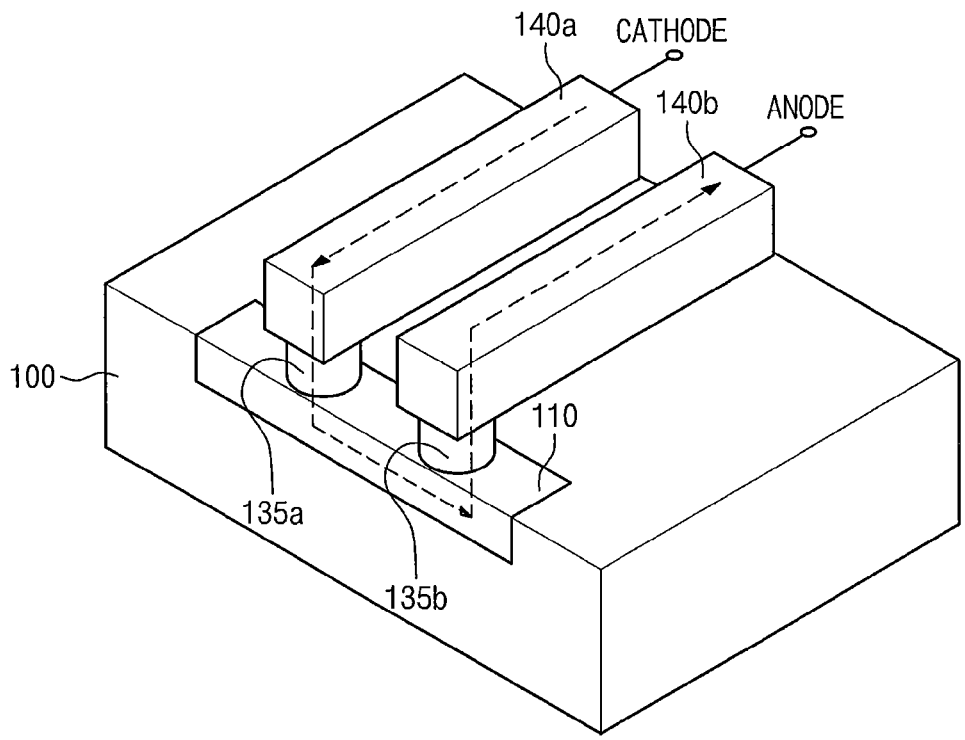
FIG. 1 is a perspective view of a fuse structure according to an exemplary embodiment of the inventive concept.

The advantages and features of the inventive concept and methods of achieving them will be apparent from the exemplary embodiments that are described in more detail below with reference to the accompanying drawings. It should be noted, however, that the inventive concept is not limited to the following exemplary embodiments, and may be implemented in various forms. Accordingly, it will be understood that the exemplary embodiments are provided only to disclose the inventive concept and are not limiting to the scope of the inventive concept.

It will be understood that when an element is referred to herein as being "on" another element, it can be directly on the other element, or intervening elements may also be present. In contrast, when an element is referred to as being "directly on" another element, there are no intervening layers present.

Exemplary embodiments of the invention are described below with reference to cross-sectional views, which are exemplary drawings of certain embodiments of the inventive concept. It will be appreciated, however, that the exemplary drawings may be modified by manufacturing techniques and/or tolerances. Accordingly, the exemplary embodiments of the invention are not limited to specific configurations shown in the drawings, and include modifications that may occur due to, for example, the manufacturing technique used. For example, an etched region that is illustrated in the drawings as having sidewalls that are at a right angle to a bottom surface of the region may be formed in a rounded shape or formed to have a predetermined curvature. Therefore, it will be appreciated that the regions shown in the drawings may be schematic in nature. In addition, the shapes of the regions shown in the drawings exemplify specific shapes of regions in exemplary embodiments and do not limit the invention.

Terms such as first, second, and third are used herein to describe various elements in various embodiments of the inventive concept. These terms are used only to distinguish one element from another element, and hence are not limiting.

The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "including" or derivatives thereof, when used in the specification, specify the presence of stated features, integers, steps, operations, elements, and/or components, but do not preclude the presence or addition of one or more other features, integers, steps, operations, elements, components, and/or groups thereof.

Hereinafter, embodiments of the inventive concept will be described more fully with reference to accompanying drawings.

Figure 2:
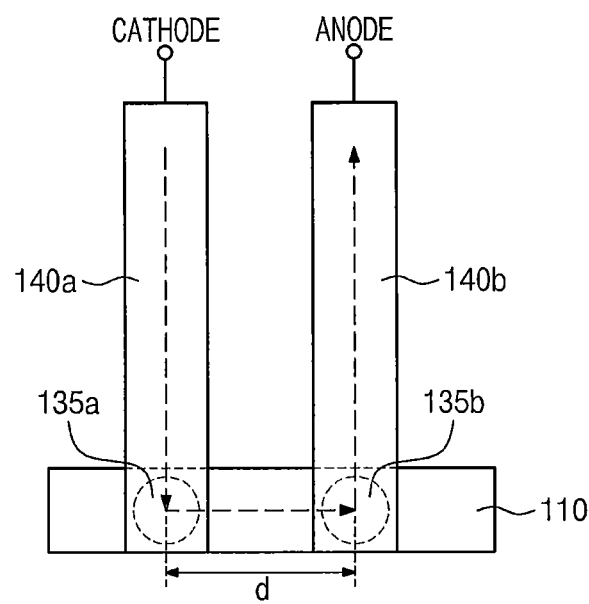
FIG. 2 is a top plan view of the fuse structure in FIG. 1.

FIG. 1 is a perspective view of a fuse structure according to an exemplary embodiment of the inventive concept. FIG. 2 is a top plan view of the fuse structure of FIG. 1.

Referring to FIGS. 1 and 2, the fuse structure may include a conductive line 110, a first via 135$a$, a second via 135$b$, a cathode electrode line 140$a$, and an anode electrode line 140$b$. Herein, the term "via" is used to refer to a connecting structure that connects a first element to a second element. While the vias 135$a$ and 135$b$ are cylindrical structures, it will be appreciated that vias having other shapes may be used.

The conductive line 110 may extend on a substrate 100 in a first direction. The conductive line 110 may include at least one material selected from the group consisting of tungsten, aluminum, silver, and gold. According to an exemplary embodiment, a length-to-width ratio (L/W) of the conductive line 110 may be between about 1 to about 100.

The first and second vias 135$a$ and 135$b$ may be disposed on the conductive line 110. If the center-to-center distance between the first and second vias 135$a$ and 135$b$ is "d", the length of the conductive line 110 may be, for example, 3*d or more.

According to an exemplary embodiment, each of the first and second vias 135a and 135b may have a diameter (or other cross-sectional width for vias with non-circular cross-sections) that is at least a minimum critical dimension of a semiconductor device that includes the fuse structure. More specifically, a minimum critical dimension of each semiconductor device having the fuse structure may be decided according to a design rule, and each of the first and second vias 135a and 135b may have a diameter that is at least the minimum critical dimension.

According to an exemplary embodiment, each of the first and second vias 135a and 135b may include a material having higher electromigration (EM) speed than a material included in the conductive line 110. For example, the first and second vias 135a and 135b may include copper or a copper compound, which has a higher electromigration speed than does tungsten, aluminum, silver or gold.

The cathode electrode line 140a may be electrically connected to the first via 135a. The first via 135a may be self-aligned with the cathode electrode line 140a.

According to an exemplary embodiment, the cathode electrode line 140a may be one-body with the first via 135a. In other words, the cathode electrode line 140a may be formed of substantially the same material as the material included in the first via 135a such that the cathode electrode line 140a and the first via 135a comprise a unitary structure. For example, the cathode electrode line 140a may include copper or a copper compound.

According to an exemplary embodiment, a length-to-width ratio (L/W) of the cathode electrode line 140a may be between about 1 and about 100.

As an example, the cathode electrode line 140a may extend in a second direction that is perpendicular to the first direction. As another example, the cathode electrode line 140a may extend in the first direction.

The anode electrode line 140b may be electrically connected to the second via 135b. The second via 135b may be self-aligned with the anode electrode line 140b.

According to an exemplary embodiment, the anode electrode line 140b may be one-body with the second via 135b. The anode electrode line 140b may include substantially the same material as a material included in the second via 135b. For example, the anode electrode line 140b may include copper or a copper compound.

According to an exemplary embodiment, a length-to-width ratio (L/W) of the anode electrode line 140b may be between about 1 and about 100.

The anode electrode line 140b may extend parallel to the cathode electrode line 140a. As an example, the anode electrode line 140b may extend in a second direction that is perpendicular to the first direction. As another example, the anode electrode line 140b may extend in the first direction.

The first and second vias 135a and 135b may be formed simultaneously, and the cathode electrode line 140a and the anode electrode line 140b may be formed simultaneously. Consequently, top surfaces of the first and second vias 135a and 135b may each be at a first level above a bottom surface of the substrate 100, and top surfaces of the cathode and anode electrode lines 140a and 140b may each be at a second level above the bottom surface of the substrate 100.

In the present embodiment, only a single first via 135a is shown connected to the cathode electrode line 140a. However, a plurality of first vias 135a may be connected to the cathode electrode line 140a in other embodiments. In addition, a plurality of second vias 135b may be connected to the anode electrode line 140b. The number of vias 135a and 135b connected to the cathode and anode electrode lines 140a and 140 is not limited in the present embodiment.

A method of blowing a fuse structure according to an exemplary embodiment of the inventive concept will now be described hereinafter with reference to FIGS. 3, 4A and 4I. FIG. 3 is a flowchart illustrating a method of blowing a fuse structure according to an exemplary embodiment of the inventive concept, and FIGS. 4A and 4B are cross-sectional views illustrating the method of blowing the fuse structure that is described in the flowchart of FIG. 3.

Referring to FIG. 3, an electrical open-circuit may be formed by applying an electrical stress that "blows" a fuse structure. The electrical stress may be created by applying a voltage difference between the cathode electrode line 140a and the anode electrode line 140 of the fuse structure of FIGS. 1 and 2 that creates a current flow that exceeds a certain amount (S100).

Figure 4A:
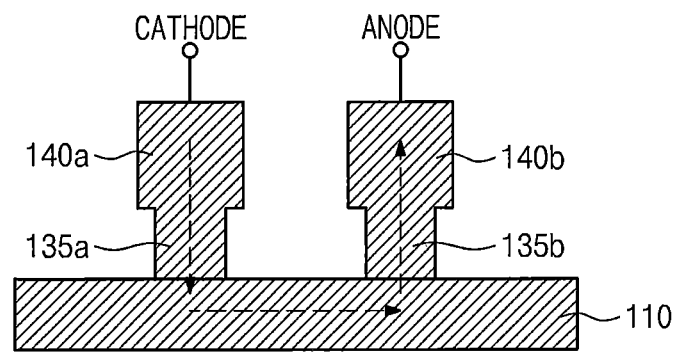
FIGS. 4A and 4B are cross-sectional views illustrating the method of blowing a fuse structure that is described in the flowchart of FIG. 3.
Figure 4B:
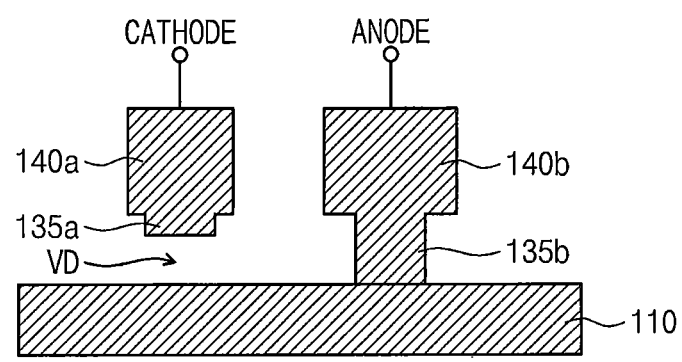

Referring to FIGS. 3 and 4A, when the electrical stress is applied, free electrons have kinetic energy and metal atoms may move in a constant direction as the free electrons collide with the metal atoms. The constant direction may be the direction in which the electrons migrate (flow) in response to the applied voltage differential. This phenomenon is called electromigration.

According to an exemplary embodiment, electrons may be introduced through the cathode electrode line 140a and may migrate downstream toward the conductive line 11Q through the first via 135a. The electrons may then migrate from the conductive line 110 to the anode electrode line 140b through the second via 135b (S110).

According to an exemplary embodiment, the cathode electrode line 140a and the first via 135a may include a material that has a higher electromigration rate than the material used to form the conductive line 110. As an example, the cathode electrode line 140a and the first via 135a may include copper, and the conductive line 110 may include tungsten. In this case, since an electromigration rate of the copper included in the cathode electrode line 140a and the first via 135a is high, the copper may move to the anode electrode line 140b. Due to this phenomenon, the copper included in the cathode electrode line 140a and the first via 135a moves to the anode electrode line 140b to gradually increase a size of the anode electrode line 140b.

Referring to FIGS. 3 and 4B, a void VD may be formed in the first via 135a when a high voltage difference occurs between the cathode electrode line 140a and the anode electrode line 140b. This void may form as a result of the electromigration of copper in the first via 135a to the anode conductive line 140b. Thus, an electrical open-circuit may arise between the cathode electrode line 140a and the conductive line 110 (S120) due to the formation of the void VD.

According to an exemplary embodiment, electrons migrate downstream from the cathode electrode line 140a through the first via 135a to cause the void VD to be formed in the first via 135a. Thus, a position where the void VD is formed may be easily controlled.

Since the first and second vias 135a and 135b and the cathode and anode electrode lines 140a and 140b include a metal, a high resistance difference may be exhibited before/after the void VD creates the electrical open-circuit. That is, the electrically open-circuited (blown) fuse may have a significantly higher resistance than a fuse that is not electrically open-circuited.

Figure 5:
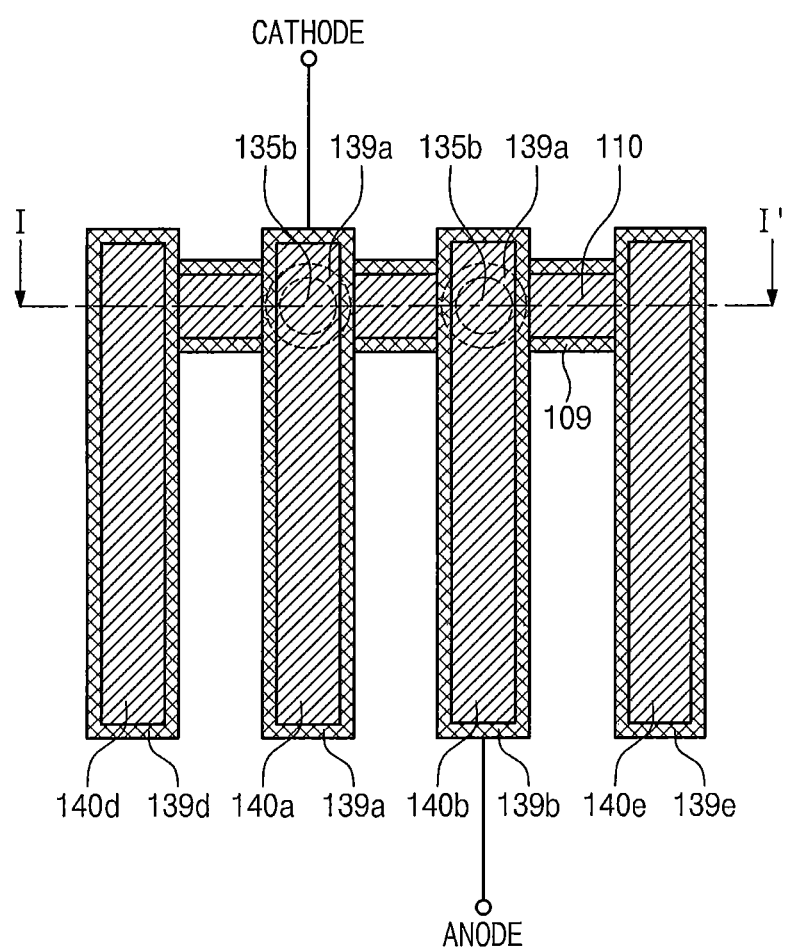
FIG. 5 is a top plan view of a fuse structure according to another exemplary embodiment of the inventive concept.
Figure 6:
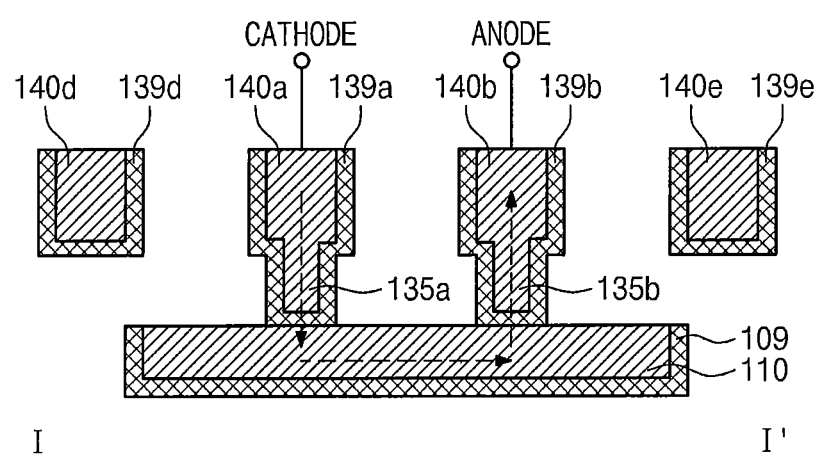
FIG. 6 is a cross-sectional view taken along the line I-I' in FIG. 5.

FIG. 5 is a top plan view of a fuse structure according to another exemplary embodiment of the inventive concept, and FIG. 6 is a cross-sectional view taken along the line I-I' in FIG. 5.

Referring to FIGS. 5 and 6, the fuse structure may include a conductive line 110, a first via 135a, a second via 135b, a cathode electrode line 140a, an anode electrode line 140b, and dummy patterns 140d and 140e.

The dummy patterns 140d and 140e may be provided to facilitate adjusting the widths of the cathode electrode line 140a and the anode electrode line 140b. According to an exemplary embodiment, the dummy patterns 140d and 140e may include a first dummy pattern 140d that is disposed adjacent the cathode electrode line 140a and a second dummy pattern 140e that is disposed adjacent the anode electrode line 140b. The first and second dummy patterns 140d and 140e may include substantially the same material as a material included in the cathode and anode electrode lines 140a and 140b.

In the present embodiment, it is shown that the first and second dummy patterns 140d and 140e have substantially the same shape as the cathode and anode electrode lines 140a and 140b. However, the shape of the first and second dummy patterns 140d and 140e are not limited to having the same shapes as the cathode and anode electrode lines 140a and 140b.

The first and second dummy patterns 140d and 140e are not electrically connected to the conductive line 110 and may be formed to facilitate adjusting the widths of the cathode and anode electrode lines 140a and 140b. Thus, the material and shape of the first and second dummy patterns 140d and 140e are not limited.

The fuse structure may further include a first barrier layer 109. The barrier layer 109 may, for example, cover a bottom surface and one or more side surfaces of the conductive line 110. Second barrier layers 139a and 139b may also be provided that cover, respectively, bottom surfaces and side surfaces of the first via 135a and the cathode electrode line 140a, and bottom surfaces and side surfaces of the second via 135b and the anode electrode line 140b. The first barrier layer 109 and the second barrier layers 139a and 139b may include, for example, one of titanium, titanium nitride, tantalum, and tantalum nitride.

The conductive line 110, the first via 135a, the second via 135b, the cathode electrode line 140a, and the anode electrode line 140b in FIGS. 5 and 6 are substantially identical to the conductive line 110, the first via 135a, the second via 135b, the cathode electrode line 140a, and the anode electrode line 140b in FIGS. 1 and 2, and hence will not be described in further detail herein.

FIGS. 7A to 15A are top plan views illustrating a method of manufacturing a fuse structure according to an exemplary embodiment of the inventive concept, and FIGS. 7I to 15I are cross-sectional views taken along the lines I-I' and II-II' in FIGS. 7A to 15A.

Figure 7A:
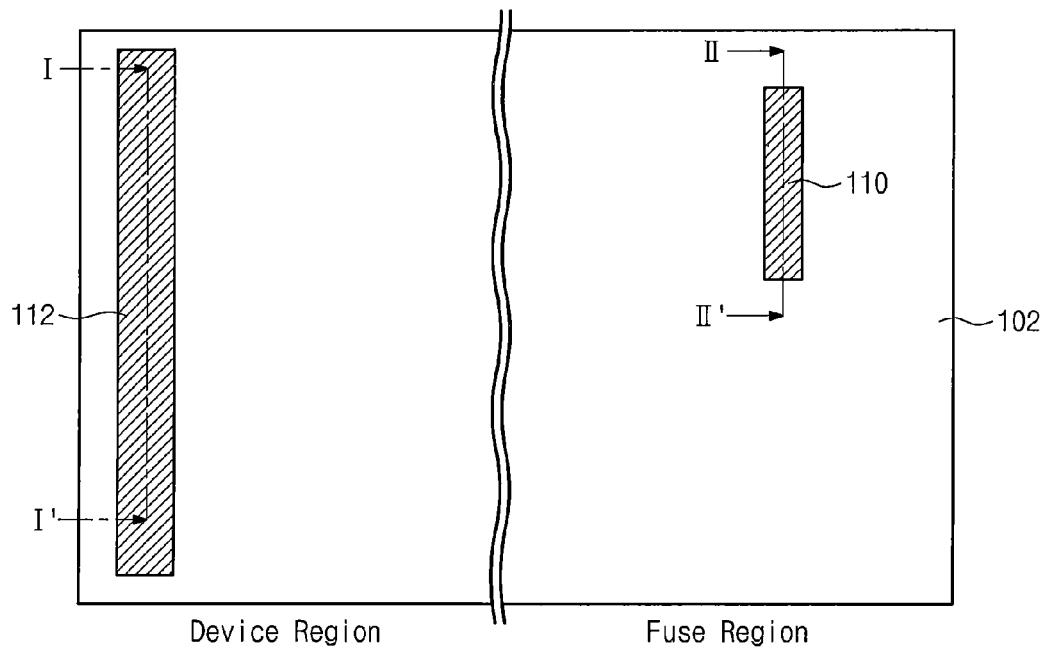
Figure 7B:
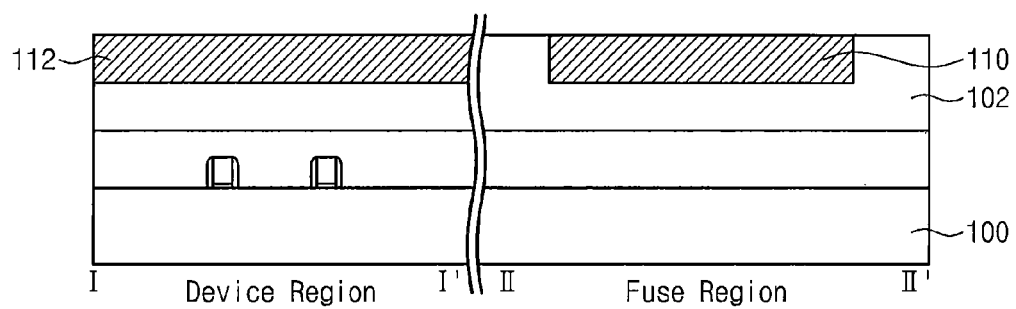

Referring to FIGS. 7A and 7B, a conductive line 110 may be formed on a substrate 100.

The substrate 100 may include a device region in which memory cells or logic cells are formed and a fuse region in which a fuse structure is formed. The substrate 100 may be a semiconductor substrate that includes, for example, silicon, germanium or silicon/germanium. Alternatively, the substrate 100 may be a silicon-on-insulator (SOI) substrate.

A first insulating layer 102 is formed on the substrate 100. After at least one portion of the first insulating layer 102 is etched, a conductive layer may be formed on the first insulating layer 102. A first interconnection line 112 and a conductive line 110 may be formed by planarizing the conductive layer to expose a top surface of the first insulating layer 102. The first interconnection line 112 and the conductive line 110 may include at least one material selected from the group consisting of tungsten, aluminum, silver, and gold. According to an exemplary embodiment, the first interconnection line 112 may be formed in the device region and may be electrically connected to memory cells or logic cells. The conductive line 110 may be formed in the fuse region. The first interconnection line 112 and the conductive line 110 may be formed by a single process.

Optionally, a first barrier layer (not shown) may be further formed conformally on the partially etched first insulating layer 102 before formation of the conductive layer. The first barrier layer may include at least one of titanium, titanium nitride, tantalum, and tantalum nitride.

Figure 8A:
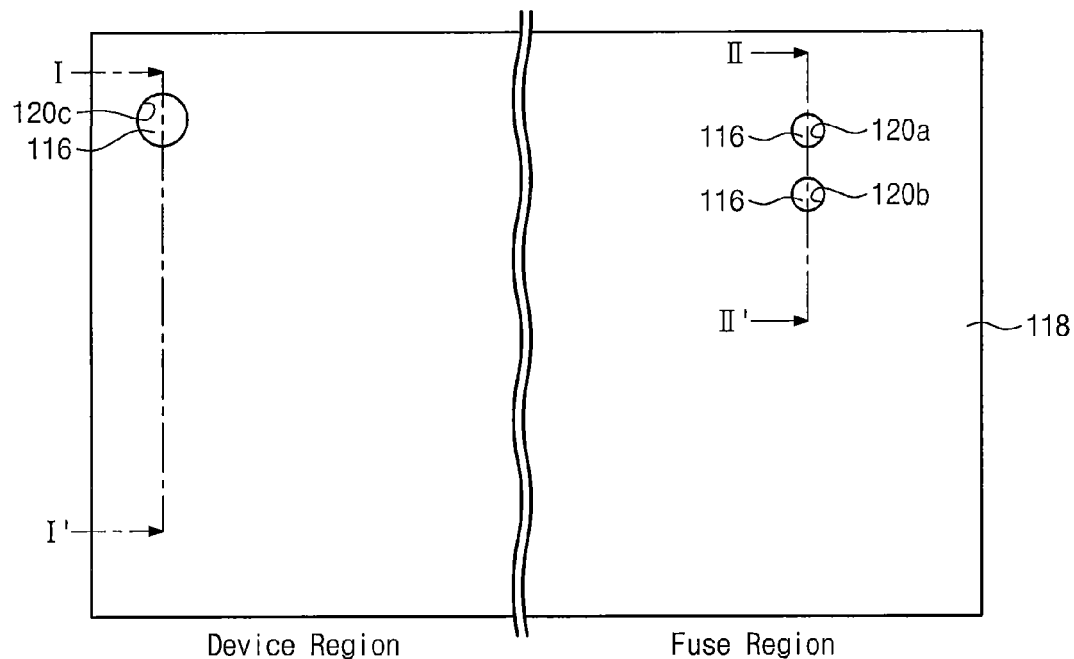
Figure 8B:
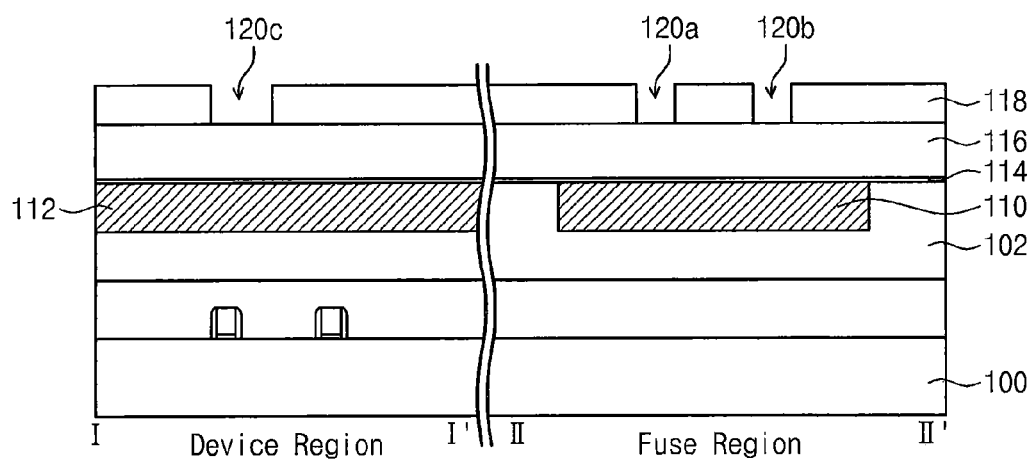

Referring to FIGS. 8A and 8B, a first etch-stop layer 114, a second insulating layer 116, and a first mask pattern 118 may be formed on the first interconnection line 112 and the conductive line 110.

In an etch process using a working etchant, the first etch-stop layer 114 may include a material having an etch selectivity with respect to materials of the second insulating layer 116 and the conductive line 110. For example, if the second insulating layer 116 includes oxide and the conductive line 110 includes a metal, the first etch-stop layer 114 may include silicon nitride.

A second insulating layer 116 may be formed on the first etch-stop layer 114. The second insulating layer 116 may include silicon oxide, silicon nitride or silicon oxynitride.

The first mask pattern 118 may include a photoresist pattern and/or a hard mask pattern. The first mask pattern 118 may include a first hole 120c that overlaps the first interconnection line 112 and second and third holes 120a and 120b that overlap the conductive line 110.

Figure 9A:
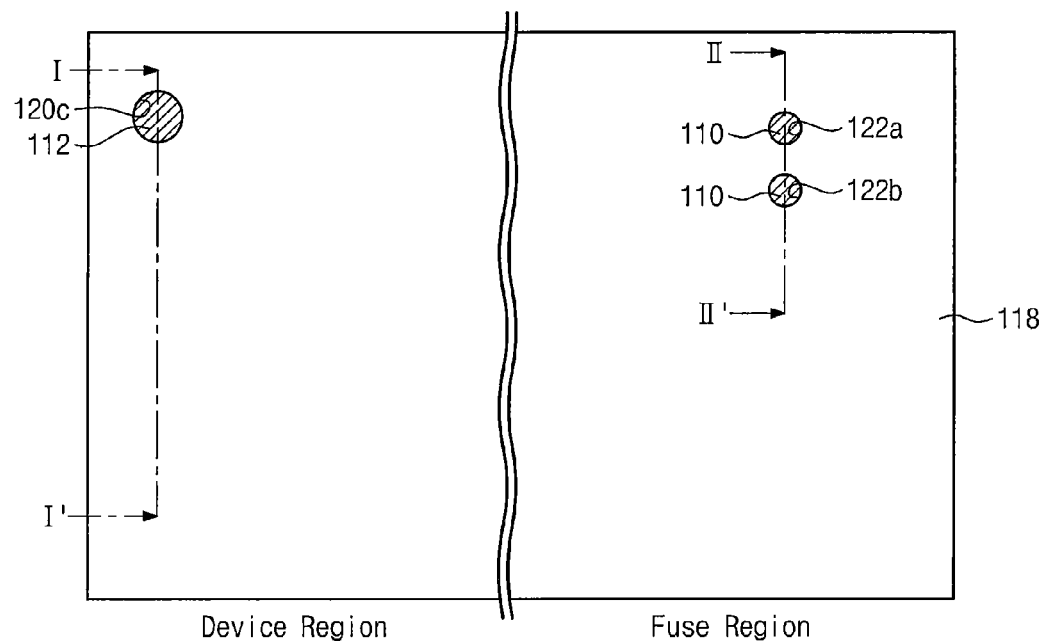
Figure 9B:
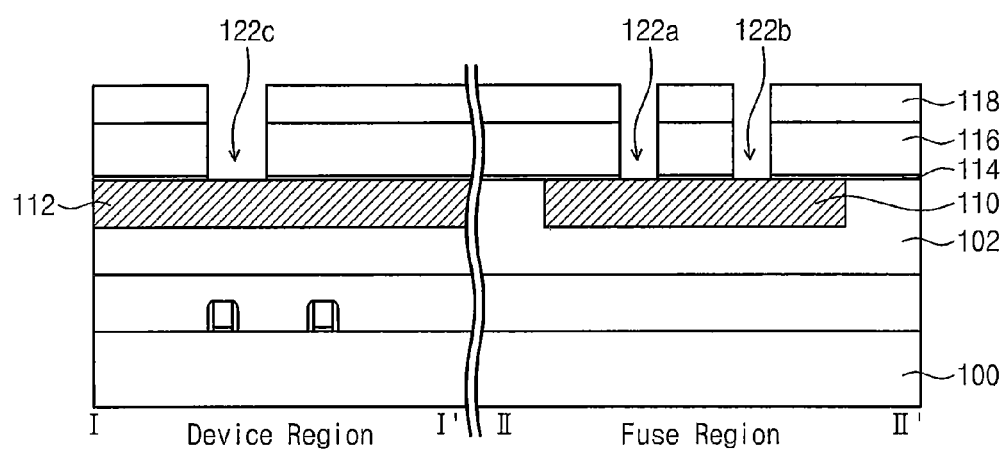

Referring to FIGS. 9A and 9B, an etch process is performed using the first mask pattern 118 to form a first contact hole 122c that exposes the first interconnection line and first and second via holes 122a and 122b that expose the conductive line 110.

In the etch process, the first etch-stop layer 114 may be etched after etching the second insulating layer 116 down to a top surface of the first etch-stop layer 114.

Figure 10A:
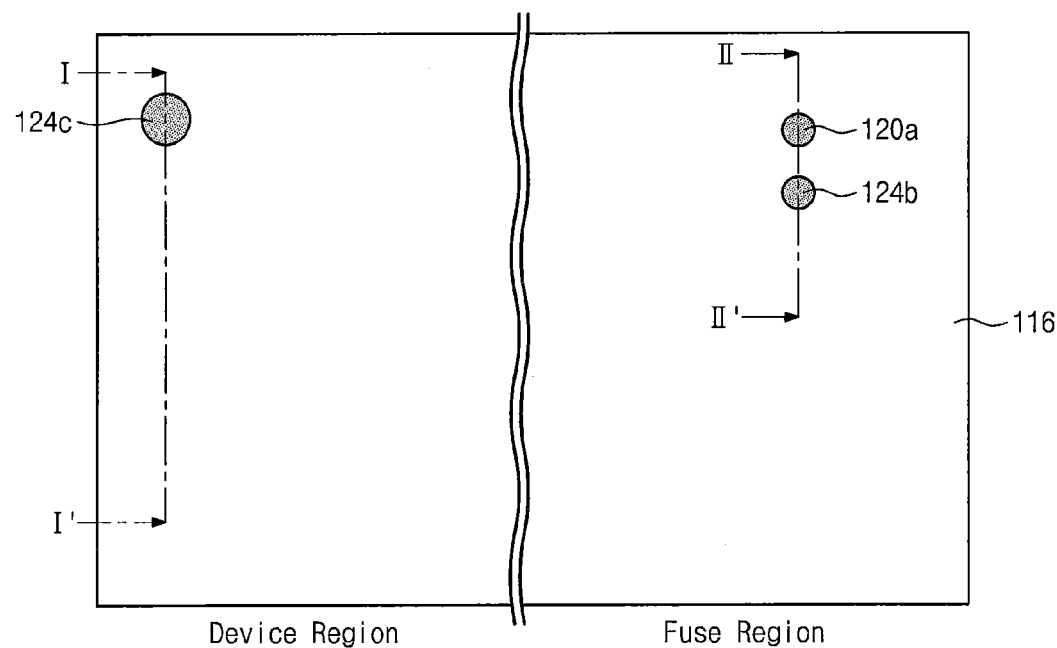
Figure 10B:
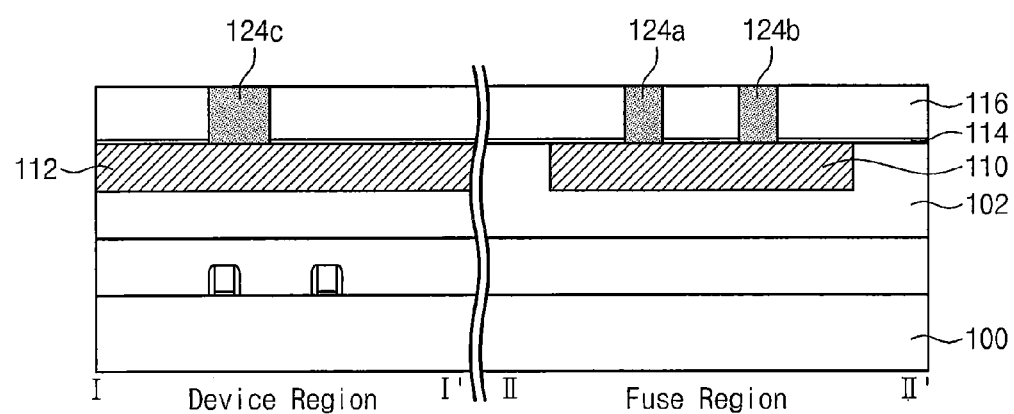

Referring to FIGS. 10A and 10B, after removal of the first mask pattern 118, sacrificial patterns 124c, 124a, and 124b may be formed within the first contact hole 122c and the first and second via holes 122a and 122b, respectively.

Specifically, after removal of the first mask pattern 118, a sacrificial layer may be formed on the second insulating layer 116 to fill the first contact hole 122c and the first and second via holes 122a and 122b. An upper portion of the sacrificial layer may be planarized to expose a top surface of the second insulating layer 116.

Figure 11A:
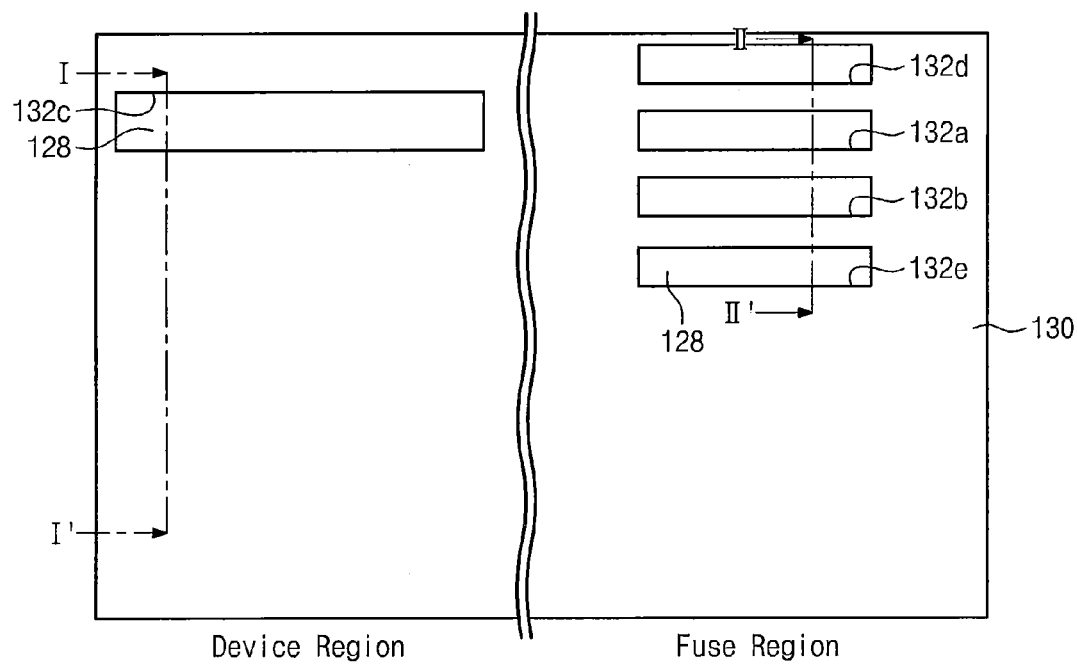
Figure 11B:
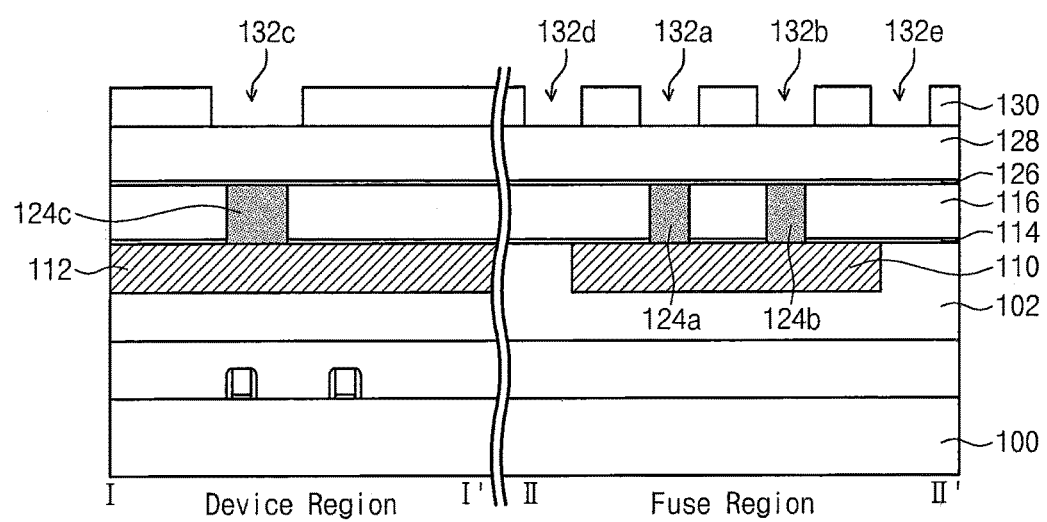

Referring to FIGS. 11A and 11B, a second etch-stop layer 126, a third insulating layer 128, and a second mask pattern 130 may be formed on the sacrificial patterns 124a, 124b, and 124c and the second insulating layer 116.

In an etch process using a working etchant, the second etch-stop layer 126 may include a material having an etch selectivity with respect to materials included in the third insulating layer 128 and the sacrificial patterns 124a, 124b, and 124c. For example, the second etch-stop layer 126 may include silicon nitride.

The third insulating layer 128 may be formed on the second etch-stop layer 126. The third insulating layer 128 may include silicon oxide, silicon nitride or silicon oxynitride.

The second mask pattern 130 may include a photoresist pattern and/or a hard mask pattern. The second mask pattern 130 may include a first opening 132c that overlaps the sacrificial pattern 124c that fills the first contact hole 122c, a second opening 132a that overlaps the sacrificial pattern 124a that fills the first via hole 122a, and a third opening 132b that overlaps the sacrificial pattern 124b that fills the second via hole 122b.

According an exemplary embodiment, the second mask pattern 130 may further include a first dummy opening 132d that is adjacent the second opening 132a that may be used to adjust the width of the second opening 132a. In addition, the second mask pattern 130 may further include a second dummy opening 132e that is adjacent the third opening 132b that may be used to adjust the width of the third opening 132b.

More specifically, conventionally, a reticle may be used to form the second mask pattern 130 that includes the second opening 132a and the third opening 132b. The reticle may be different from a planar shape of the second mask pattern 130. When the reticle has no pattern corresponding to the first dummy opening 132d, the second opening 132a of the second mask pattern 130 may be formed to be greater than a desired width. According to an exemplary embodiment, the reticle and the second mask pattern 130 may further include a first dummy opening 132d to adjust the width of the second opening 132a. For the same reason, the second mask pattern 130 may further include a second dummy opening 132e that is adjacent the third opening 132b.

Figure 12A:
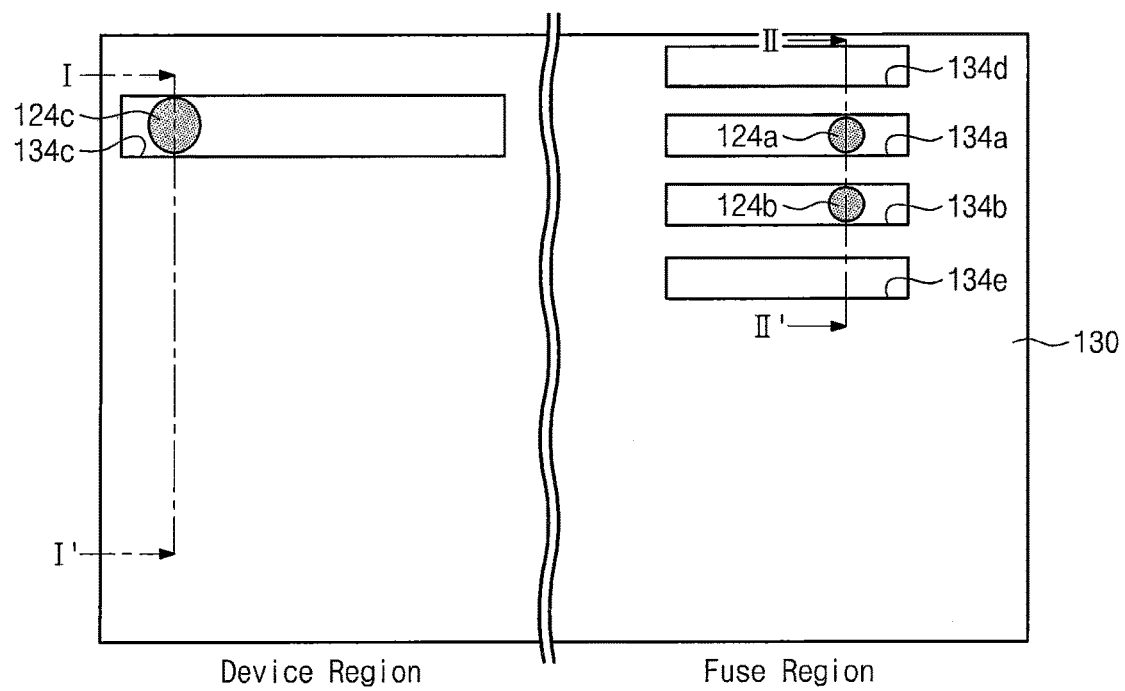
Figure 12B:
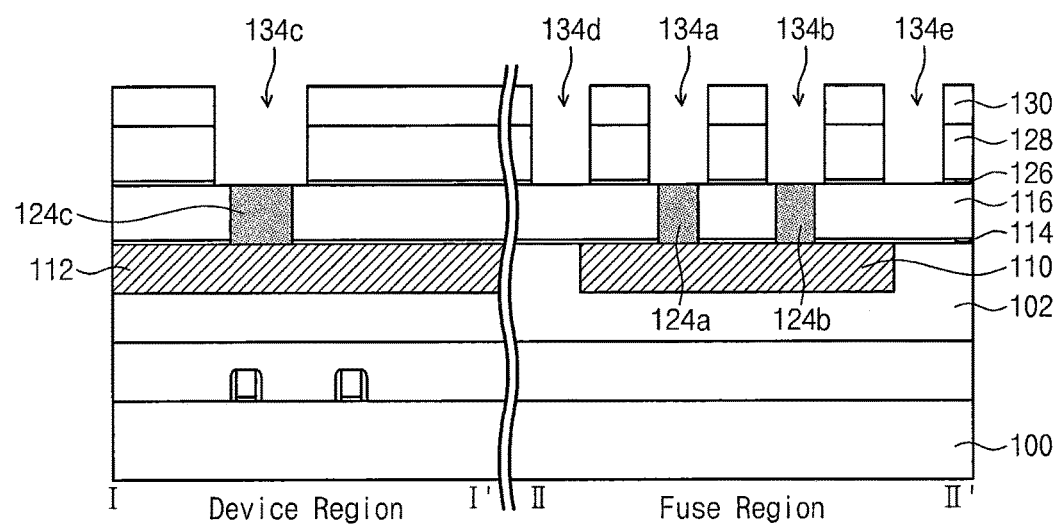

Referring to FIGS. 12A and 12B, an etch process is performed using the second mask pattern 130 to form a second interconnection line trench 134c that exposes the sacrificial pattern 124c that fills the first contact hole 122c, a cathode electrode line trench 134a that exposes the sacrificial pattern 124a that fills the first via hole 122a, and an anode electrode line trench 134b that exposes the sacrificial pattern 124b that fills the second via hole 122b. The etch process further forms a first dummy trench 134d that is adjacent the cathode electrode line trench 134a and a second dummy trench 134e that is adjacent the anode electrode line trench 134b.

In the etch process, the second etch-stop layer 126 may be etched after etching the third insulating layer 128 down to a top surface of the second etch-stop layer 126.

Figure 13A:
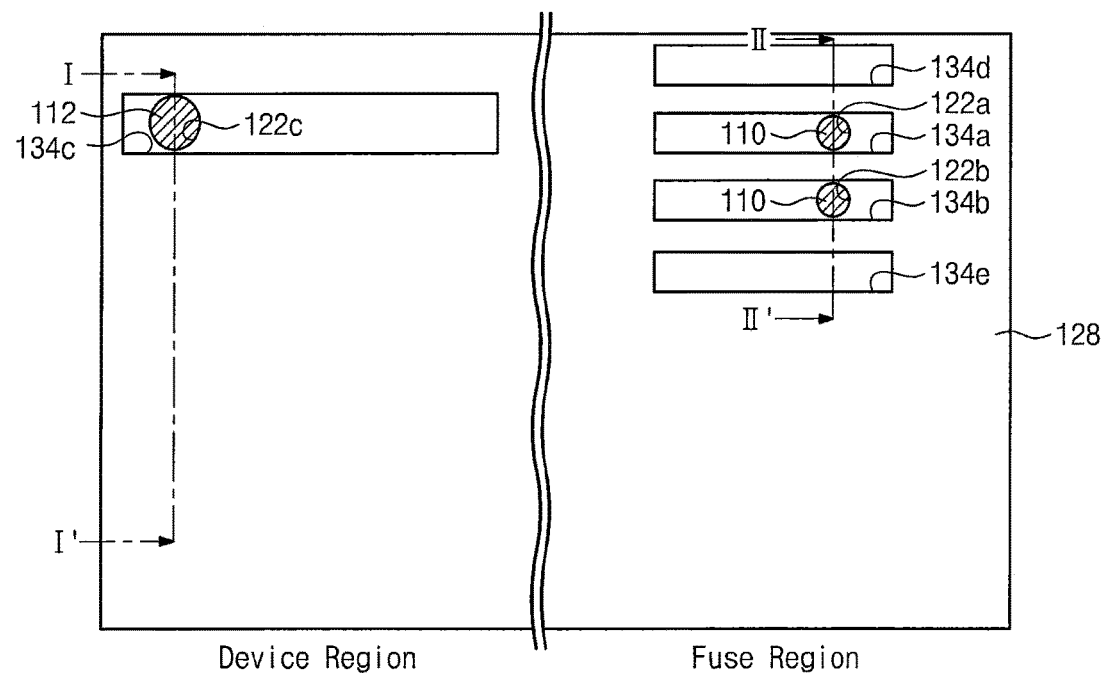
Figure 13B:
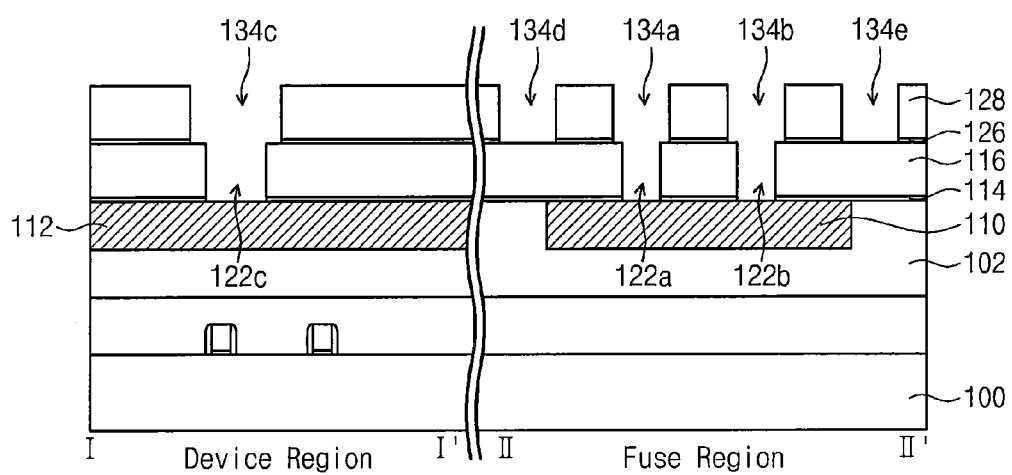

Referring to FIGS. 13A and 13I, the sacrificial patterns 124a, 124b, and 124c may be removed. In addition, the second mask pattern 130 may be removed.

The order in which the sacrificial patterns 124a, 124b, and 124c and the second mask pattern 130 are removed is not limited in embodiments of the inventive concept.

Through the processes described above with respect to FIG. 9A to FIG. 1313, in the device region, the first contact hole 122c and the second interconnection line trench 134c may be formed to communicate with each other. In the fuse region, the first via hole 122a and the cathode electrode line trench 134a may be formed to communicate with each other, and the second via hole 122b and the anode electrode line trench 134b may be formed to communicate with each other.

Figure 14A:
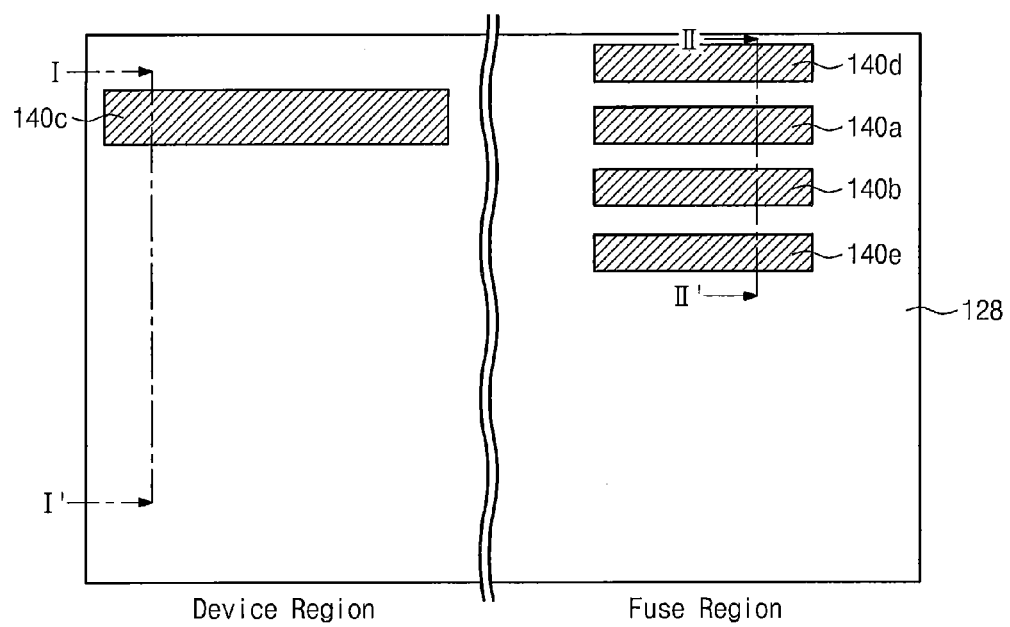
Figure 14B:
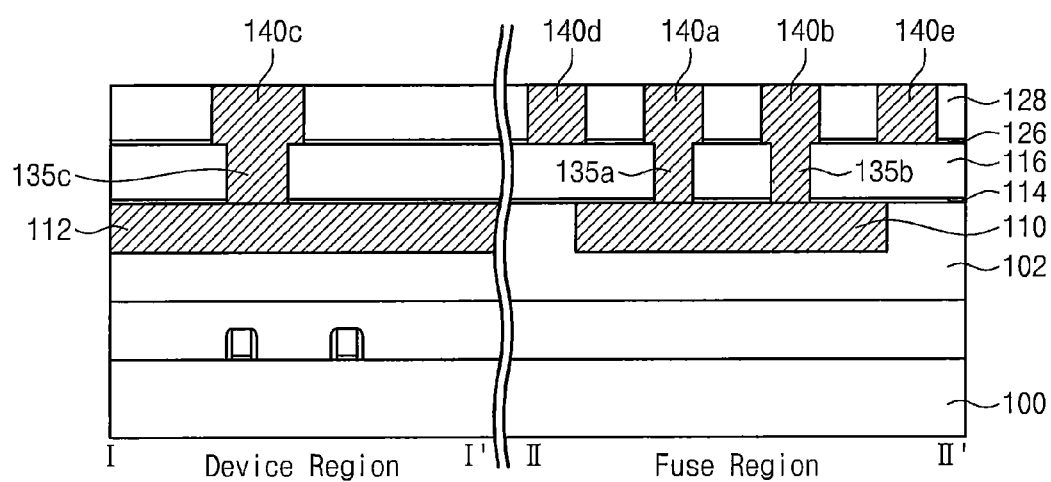

Referring to FIGS. 14A and 14B, a metal layer may be formed on the third insulating layer 128 to fill the first contact hole 122c, the second interconnection line trench 134c, the first via hole 122a, the cathode electrode line trench 134a, the second via hole 122b, the anode electrode line trench 134b, the first dummy trench 134d, and the second dummy trench 134e.

The metal layer may include a material having a higher electromigration rate than a metal included in the conductive line 110. For example the metal layer may include copper or a copper compound.

A first contact plug 135c and a second interconnection line 140c may be formed in the device region by planarizing the metal layer to expose a top surface of the third insulating layer 128. A first via 135a, a cathode electrode line 140a, a second via 135b, and an anode electrode line 140b may be formed in the fuse region. In addition, a first dummy pattern 140d and a second dummy pattern 140e may be formed in the fuse region.

Optionally, before formation of the metal layer, second barrier layers 139c, 139a, 139b, 139d, and 139e (see FIG. 6) may be conformally formed on the third insulating layer 128 and within the first contact hole 122c, the second interconnection line trench 134c, the first via hole 122a, the cathode electrode line trench 134a, the second via hole 122b, the anode electrode line trench 134b, the first dummy trench 134d, and the second dummy trench 134e. The second barrier layers 139c, 139a, 139b, 139d, and 139e may include at least one of titanium, titanium nitride, tantalum, and tantalum nitride.

Figure 15A:
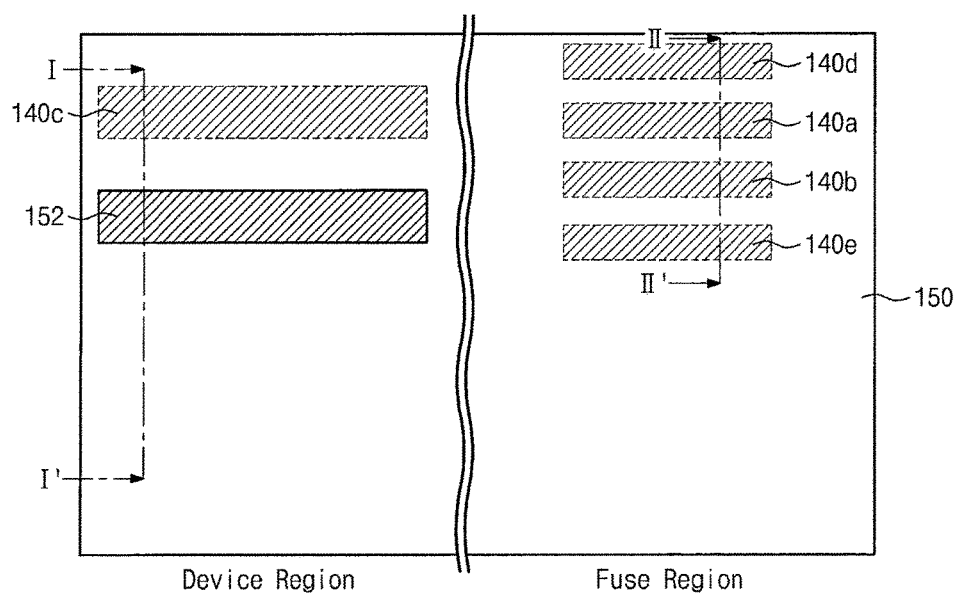
Figure 15B:
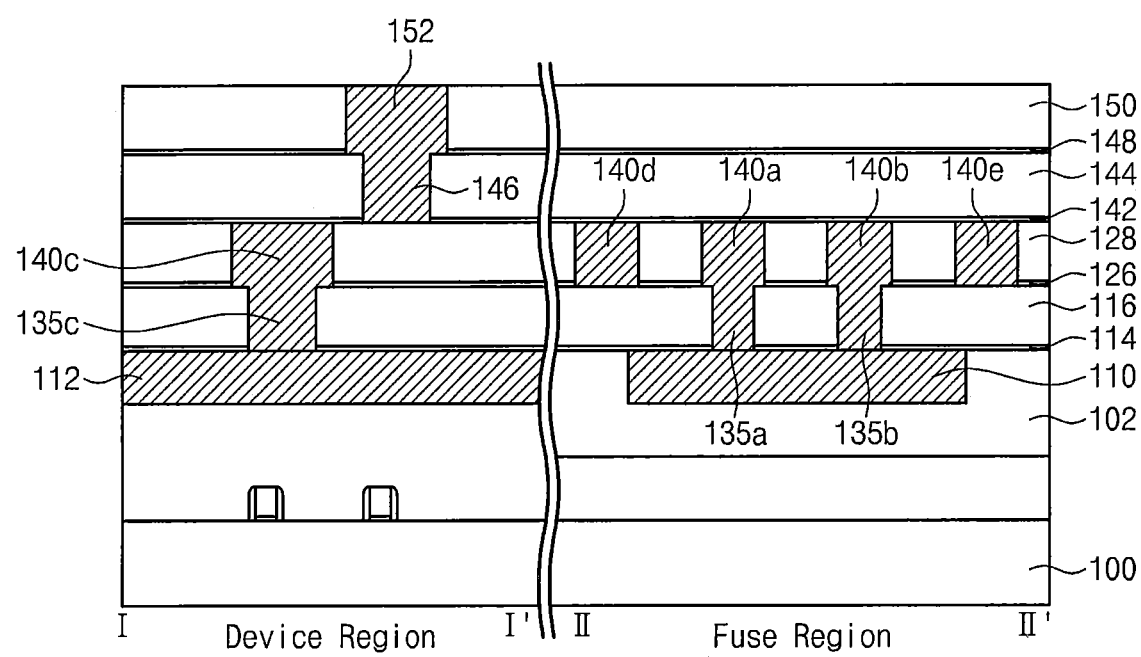

Referring to FIGS. 15A and 15B, a second contact plug 146 and a third interconnection line 152 may be formed on the device region.

Specifically, after sequentially forming a third etch-stop layer 142 and a fourth insulating layer 144 on the third insulating layer 128, a second contact hole (not shown) may be formed and a sacrificial pattern (not shown) may be formed to fill the second contact hole. After sequentially forming a fourth etch-stop layer 148 and a fifth insulating layer 150 on the fourth insulating layer 144, a third interconnection line trench (not shown) may be formed and the sacrificial pattern may be removed. The second contact plug 146 and the third interconnection line 152 may be formed by filling the second contact hole and the third interconnection line trench with a conductive material.

Optionally, before filling the second contact hole and the third interconnection line trench with the conductive material, a third barrier layer (not shown) may be formed conformally on the fourth and fifth insulating layers where the second contact hole and the third interconnection line trench are formed. The third barrier layer may include at least one of titanium, titanium nitride, tantalum, and tantalum nitride.

According to embodiments of the inventive concept, widths of cathode and anode electrode lines may be adjusted using a dummy pattern. In addition, since an electromigration rate of materials included in the cathode and anode electrode lines and first and second vias is higher than that of a material included in a conductive line, a void is formed in a first via that is connected to the cathode electrode line to control a position where a fuse is blown.

While the inventive concept has been particularly shown and described with reference to exemplary embodiments thereof, it will be apparent to those of ordinary skill in the art that various changes in form and detail may be made therein without departing from the spirit and scope of the inventive concept, which is defined by the following claims.

What is claimed is:

1. A method of blowing a fuse structure that includes a conductive line on a substrate, first and second vias on the conductive line and spaced apart from each other, a cathode electrode line electrically connected to the first via, and an anode electrode line electrically connected to the second via, where the conductive line includes a first material having a first electromigration rate and the first and second vias and the cathode and anode electrode lines include a second material having a second electromigration rate that is higher than the first electromigration rate, the method comprising:
   letting a voltage difference occur between the cathode and anode electrode lines;
   moving a portion of the second material of the cathode electrode line through the first via, the conductive line, and the second via to the anode electrode line in order to increase a width of the anode electrode line; and
   forming a void in the first via to blow the fuse structure,
   wherein the fuse structure further includes:
   a first dummy pattern adjacent the cathode electrode line; and
   a second dummy pattern adjacent the anode electrode line,
   the first and second dummy patterns including substantially the same material as the material included in the cathode and the anode electrode lines.

2. The method as set forth in claim 1, wherein electrons migrate downstream from the cathode electrode line to the first via.

3. The method as set forth in claim 1, wherein:
   the first material includes at least one of tungsten, aluminum, silver, gold, and a compound thereof; and
   the second material includes at least one of copper and/or a copper compound.

4. The method as set forth in claim 1, wherein:
   a length to width ratio of the conductive line is between 1 and 100.

5. The method as set forth in claim 1, wherein:
   a length-to-width ratio of the cathode electrode line is between 1 and 100; and
   a length-to-width ratio of the anode electrode line is between 1 and 100.

6. The method as set forth in claim 1, wherein the fuse structure further includes:
   a first barrier layer covering a bottom surface and a side surface of the conductive line; and
   a second barrier layer covering a bottom surface and a side surface of the first via, a side surface of the cathode electrode line, a bottom surface and a side surface of the second via and a side surface of the anode electrode line.

7. The method as set forth in claim 6, wherein:
   the first and second barrier layers includes one of titanium, titanium nitride, tantalum, and tantalum nitride.

8. The method as set forth in claim 1, wherein:
   a length of the conductive line is three times greater than a center-to-center distance between the first and second vias.

9. The method as set forth in claim 1, wherein:
   a dimension of each of the first and second vias has a minimum critical dimension of a semiconductor device that includes the fuse structure.

10. The method of claim 1, wherein the first and second dummy patterns are not electrically connected to the conductive line.

11. The method of claim 1, wherein the first and second dummy patterns extend parallel to the cathode electrode line and the anode electrode line.

12. A method of fabricating a fuse structure, the method comprising:
   forming a conductive line on a substrate;
   forming first and second vias on the conductive line, the first and second vias spaced apart from each other;
   forming a cathode electrode line electrically connected to the first via; and
   forming an anode electrode line electrically connected to the second via,
   wherein the conductive line includes a first material having a first electromigration rate,
   wherein the first and second vias and the cathode and anode electrode lines include a second material having a second electromigration rate that is different from the first electromigration rate,
   wherein the fuse structure further includes:
   a first dummy pattern adjacent to the cathode electrode line; and
   a second dummy pattern adjacent to the anode electrode line, and
   wherein the first and second dummy patterns include substantially the same material as the material included in the cathode and the anode electrode lines.

13. The method of claim 12, further comprising:
   letting a voltage difference occur between the cathode and anode electrode lines;
   moving a portion of the second material of the cathode electrode line through the first via, the conductive line, and the second via to the anode electrode line to increase a width of the anode electrode line; and
   forming a void in the first via to blow the fuse structure.

14. The method of claim 12, wherein the first and second dummy patterns are not electrically connected to the conductive line.

15. The method of claim 12, wherein the second electromigration rate higher than the first electromigration rate.

16. A method of fabricating a fuse structure, the method comprising:
   forming a conductive line on a substrate;
   forming first and second vias on the conductive line, the first and second vias being spaced apart from each other;
   forming a cathode electrode line electrically connected to the first via;
   forming an anode electrode line electrically connected to the second via; and
   forming a void in the first via to blow the fuse structure,
   wherein the conductive line includes a first material having a first electromigration rate,
   wherein the first and second vias and the cathode and anode electrode lines include a second material having a second electromigration rate that is different from the first electromigration rate,
   wherein the fuse structure further includes:
   a first dummy pattern adjacent the cathode electrode line; and
   a second dummy pattern adjacent the anode electrode line, and
   wherein the first and second dummy patterns include substantially the same material as the material included in the cathode and the anode electrode lines.

17. The method of in claim 16, wherein electrons migrate downstream from the cathode electrode line to the first via.

18. The method of claim 16 wherein the first and second dummy patterns are not electrically connected to the conductive line.

19. The method of claim 16, wherein the second electromigration rate higher than the first electromigration rate.

* * * * *